(12) United States Patent
Takeuchi et al.

(10) Patent No.: US 7,298,307 B2
(45) Date of Patent: Nov. 20, 2007

(54) ΣΔ-ANALOG-TO-DIGITAL MODULATOR AND DIGITAL FILTER FOR IMPROVED NOISE IMMUNITY

(75) Inventors: Makoto Takeuchi, Tokyo (JP); Naoki Maeda, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/389,426

(22) Filed: Mar. 23, 2006

(65) Prior Publication Data
US 2006/0214829 A1 Sep. 28, 2006

(30) Foreign Application Priority Data
Mar. 25, 2005 (JP) ............................. 2005-087454

(51) Int. Cl.
*H03M 3/00* (2006.01)
(52) U.S. Cl. ...................................... 341/143; 341/155
(58) Field of Classification Search ................ 341/155, 341/143, 140
See application file for complete search history.

(56) References Cited

U.S. PATENT DOCUMENTS

| 4,939,516 | A | * | 7/1990 | Early | 341/143 |
| 5,349,352 | A | * | 9/1994 | Saleh | 341/143 |
| 5,451,949 | A | * | 9/1995 | Gundry | 341/143 |
| 6,418,228 | B1 | * | 7/2002 | Terai et al. | 381/71.8 |

FOREIGN PATENT DOCUMENTS

| JP | 5-37385 | 2/1993 |
| JP | 2004-247930 | 9/2004 |

* cited by examiner

*Primary Examiner*—Peguy JeanPierre
(74) *Attorney, Agent, or Firm*—John J. Penny, Jr.; Edwards Angell Palmer & Dodge LLP

(57) ABSTRACT

A ΣΔ analog-to-digital converter has a ΣΔ modulation section which executes ΣΔ modulation, and a digital filter which filters a digital signal output from the ΣΔ modulation section. The digital filter has gain properties that one of dips of a gain of the digital filter corresponds to a noise frequency which is, for example, the commercial frequency 60 Hz. Especially, the lowest frequency of the dips corresponds to the noise frequency.

6 Claims, 3 Drawing Sheets

ΣΔ-ANALOG-TO-DIGITAL MODULATOR AND DIGITAL FILTER FOR IMPROVED NOISE IMMUNITY

CROSS-REFERENCE TO RELATED APPLICATIONS

This application is based upon and claims the benefit of priority from the prior Japanese Patent Applications No. 2005-087454, filed on Mar. 25, 2005, the entire contents of which are incorporated herein by reference.

BACKGROUND OF THE INVENTION

1. Field of the Invention

This invention relates to a ΣΔ (sigma-delta) analog-to-digital converter including a ΣΔ modulation section for executing ΣΔ modulation and a digital filter for filtering a digital signal output from the ΣΔ modulation section, and in particular relates to a ΣΔ analog-to-digital converter having improved noise immunity.

2. Description of the Related Art

A ΣΔ analog-to-digital converter including a ΣΔ modulation section for executing ΣΔ modulation and a digital filter for filtering a digital signal output from the ΣΔ modulation section is known.

JP-A-2004-247930 and JP-A-5-37385 are referred to as related art.

According to an environment where a ΣΔ analog-to-digital converter is used, noise whose frequency is fixed may be mixed into an analog input signal. For example, noise of a commercial frequency (hereinafter, commercial frequency) may be superposed on an input signal, thereby adversely affecting the operation of the system using the ΣΔ analog-to-digital converter.

SUMMARY OF THE INVENTION

An object of the invention is to provide a ΣΔ analog-to-digital converter having improved noise immunity.

The invention provides a ΣΔ analog-to-digital converter, having: a ΣΔ modulation section which executes ΣΔ modulation; and a digital filter which filters a digital signal output from the ΣΔ modulation section, wherein the digital filter has gain properties that one of dips of a gain of the digital filter corresponds to a frequency of a noise.

According to the ΣΔ analog-to-digital converter, the frequency of one of the dips of the gain of the digital filter corresponds to the frequency of the noise, immunity from the noise of the corresponding frequency can be improved.

In the ΣΔ analog-to-digital converter, in the gain properties of the digital filter, the lowest frequency of the dips corresponds to the frequency of the noise.

In the ΣΔ analog-to-digital converter, the frequency of the noise may be a commercial frequency.

In the ΣΔ analog-to-digital converter, the digital filter may be a moving average filter.

The invention also provides a ΣΔ analog-to-digital converter, having: a ΣΔ modulation section which executes ΣΔ modulation; and a digital filter which filters a digital signal output from the ΣΔ modulation section, wherein the digital filter has gain properties combining a first cut-off filter that the lowest frequency of dips of a gain of the first cut-off filter corresponds to a frequency of a first noise, and a second cut-off filter that the lowest frequency of dips of a gain of the second cut-off filter corresponds to a frequency of a second noise.

According to the ΣΔ analog-to-digital converter, since the digital filter has the gain properties combining the first cut-off filter that the lowest frequency of the dips of the gain thereof corresponds to the frequency of the first noise and the second cut-off filter that the lowest frequency of the dips of the gain thereof corresponds to the frequency of the second noise, immunity from both the first noise and the second noise can be improved.

In the ΣΔ analog-to-digital converter, the frequency of the first noise or the frequency of the second noise may be a commercial frequency.

According to the ΣΔ analog-to-digital converter of the invention, since the frequency of one of the dips of the gain of the digital filter corresponds to the frequency of noise, the immunity from the noise of the corresponding frequency can be improved.

DETAILED DESCRIPTION OF THE PREFERRED EMBODIMENTS

Embodiments of a ΣΔ analog-to-digital converter according to the invention will be discussed with reference to FIGS. 1 to 3.

First Embodiment

Figure 1:
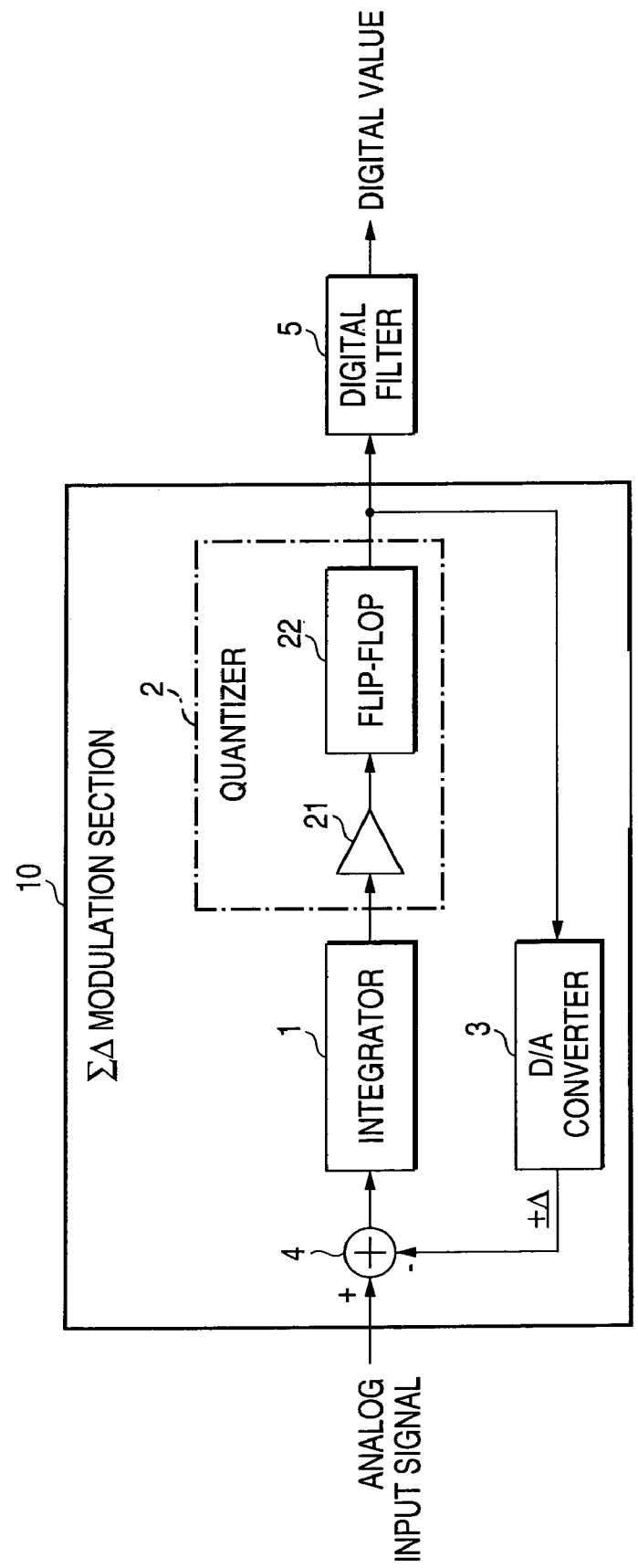
FIG. 1 is a block diagram to show the configuration of a ΣΔ analog-to-digital converter of a first embodiment of the invention.

FIG. 1 is a block diagram to show the configuration of a ΣΔ analog-to-digital converter of a first embodiment of the invention.

As shown in FIG. 1, the ΣΔ analog-to-digital converter of the first embodiment includes a ΣΔ modulation section 10 for receiving an analog input signal to execute ΣΔ modulation, and a digital filter 5 for receiving a digital signal output from the ΣΔ modulation section 10 to filter the digital signal. The digital filter 5 is implemented as a moving average filter.

The ΣΔ modulation section 10 includes an integrator 1, a one-bit quantizer 2, a D/A converter 3 for outputting +Δ or −Δ by one sampling delay, and a subtracter 4 for subtracting the output value of the D/A converter 3 from the analog input signal value. The quantizer 2 has a comparator 21, and a flip-flop 22 for latching output of the comparator 21 according to a clock.

The quantizer 2 quantizes output of the integrator 1 in a given period defined by the clock. The integrator 1 is given the value resulting from subtracting the output value (+Δ or −Δ) of the D/A converter 3 in the immediately preceding period from the analog input signal value. Thus, the operation of quantizing the integration value of the difference between the analog input signal value and the output value of the quantizer 2 in the immediately preceding period by one bit is repeated in the given period. Accordingly, the analog input signal value is converted into a one-bit coding string for output from the quantizer 2. Such a ΣΔ modulation technology is known and therefore will not be discussed here in detail.

Output of the quantizer 2 is output through the digital filter 5 at the following stage as a digital value.

In the first embodiment, the sampling frequency in the ΣΔ modulation section 10 and the tap count of the digital filter 5 are set as follows:
(1) Sampling frequency: 94.523 kHz
(2) Tap count: 3777

Figure 2:
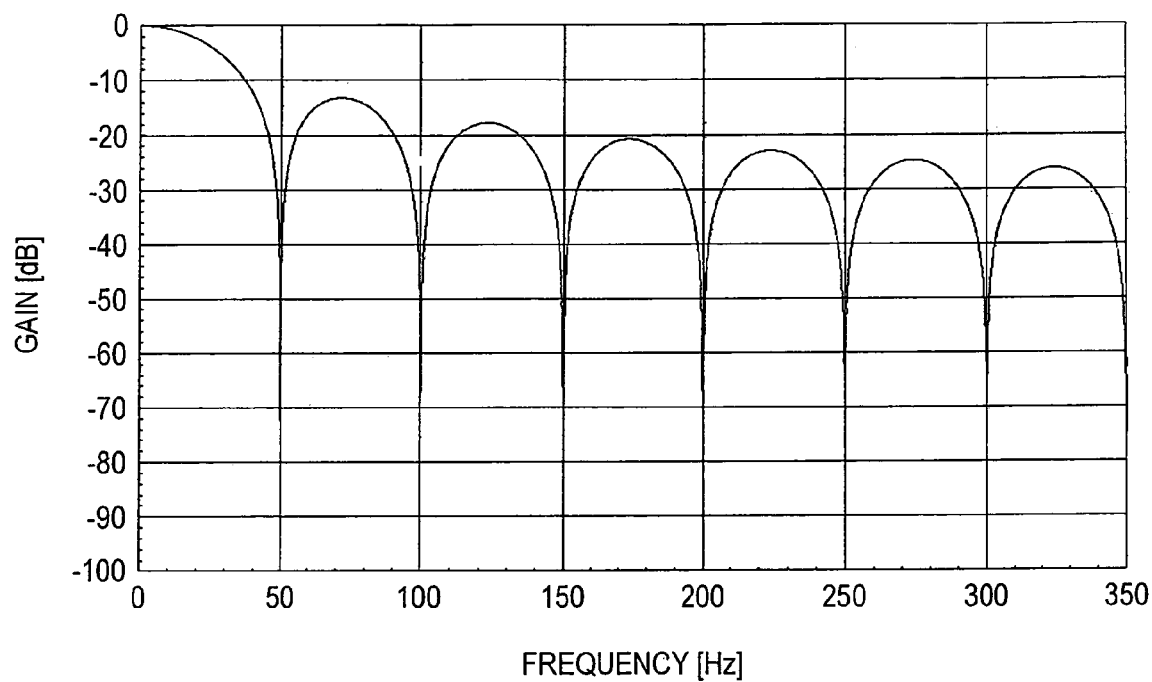
FIG. 2 is a drawing to show the gain properties of a digital filter in the ΣΔ analog-to-digital converter of the first embodiment of the invention.

The digital filter 5 is a secondary moving average filter, and has the following transfer function:

Transfer function $H50(z)=1+2z^{-1}+3z^{-2}+\ldots+1889z^{-1888}+1888z^{-1889}+\ldots+2z^{-3775}+z^{-3776}$ FIG. 2 is a drawing to show gain properties of the digital filter 5 of the first embodiment of the invention. As shown in FIG. 2, in the first embodiment, the lowest frequency of dips of the gain of the digital filter 5 is set to 50 Hz. The dips of the gain exist in an integral multiple of 50 Hz.

As such gain properties provided, the removal ratio of the signal of 50 Hz of the commercial frequency and the signal whose frequency is an integral multiple of 50 Hz can be raised. In the ΣΔ analog-to-digital converter of the first embodiment, if noise derived from the 50 Hz commercial frequency is superposed on an analog input signal, it is removed through the digital filter 5. Therefore, the noise immunity can be improved markedly.

In the first embodiment, the measures against noise derived from the 50 Hz commercial frequency are illustrated. However, the ratio between the sampling frequency and the tap count is adjusted and the lowest frequency of the dips of the gain in the digital filter 5 is matched with 60 Hz, whereby the immunity from the noise derived from the 60 Hz commercial frequency can be improved in a similar manner.

Second Embodiment

The difference of a ΣΔ analog-to-digital converter of a second embodiment of the invention from that of the first embodiment will be discussed.

In the second embodiment, the sampling frequency in the ΣΔ modulation section 10 and the tap count of the digital filter 5 in FIG. 1 are set as follows:
(1) Sampling frequency: 94.523 kHz
(2) Tap count: 3465

The transfer function of the digital filter 5 is as follows:

Transfer function $H(z)=H60(z)*H50(z)=1+2z^{-1}+3z^{-2}+\ldots+1574z^{-1573}+1575z^{-1574}+1575z^{-1575}+\ldots+1575z^{-1889}+1575z^{-1890}+1574z^{-1891}+\ldots+2z^{-3463}+z^{-3464}$ This transfer function H (z) is obtained by combining a 60 Hz cut-off filter and a 50 Hz cut-off filter when the sampling frequency is 94.523 kHz.

That is, the transfer function H (z) can be obtained by combining transfer function H60 (z) of the 60 Hz cut-off filter and transfer function H50 (z) of the 50 Hz cut-off filter, which are shown as follow:

Transfer function $H60(z)=1+z^{-1}+z^{-2}+\ldots+z^{-1574}+z^{-1575}$

Transfer function $H50(z)=1+z^{-1}+z^{-2}+\ldots+z^{-1888}+z^{-1889}$

Figure 3:
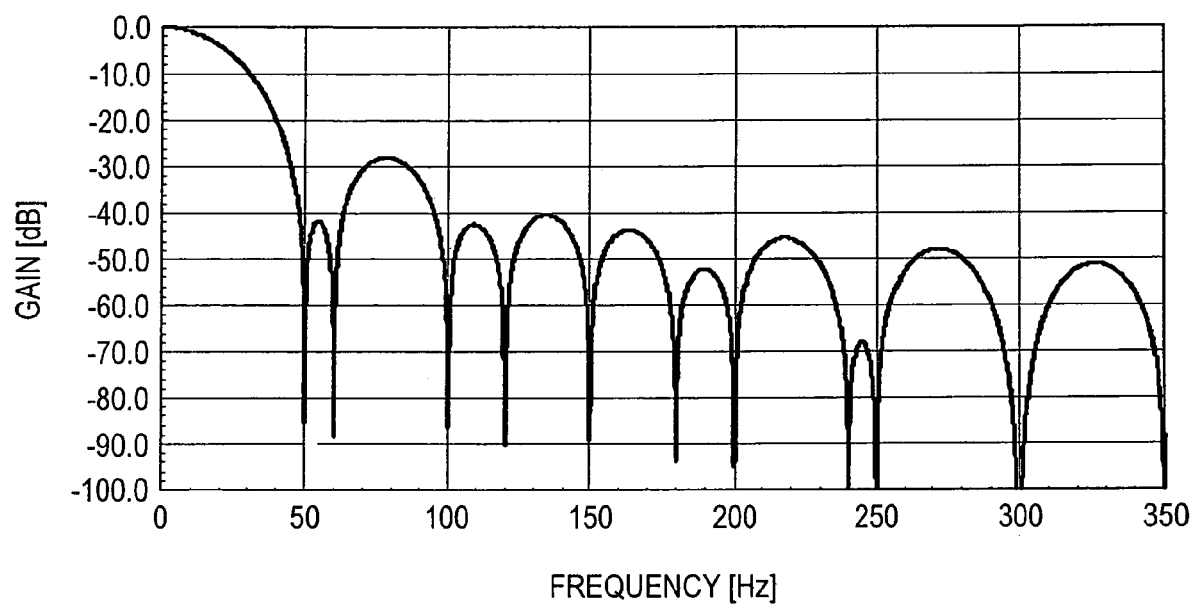
FIG. 3 is a drawing to show the gain properties of a digital filter in a ΣΔ analog-to-digital converter of a second embodiment of the invention.

FIG. 3 is a drawing to show the gain properties of the digital filter 5 of the second embodiment of the invention. As shown in FIG. 3, in the second embodiment, the transfer function equivalent to the product of the transfer function of the cut-off filter that the lowest frequency of the dips of the gain thereof is 50 Hz and the transfer function of the cut-off filter that the lowest frequency of the dips of the gain thereof is 60 Hz is obtained. The dips of the gain exist in an integral multiple of 50 Hz and in an integral multiple of 60 Hz.

As such gain properties provided, the removal ratio of the signals of 50 Hz and 60 Hz of the commercial frequencies and the signals whose frequencies are an integral multiple of 50 Hz and an integral multiple of 60 Hz can be raised. Therefore, the ΣΔ analog-to-digital converter of the second embodiment makes it possible to markedly improve immunity from the noise derived from the commercial frequency regardless of whether the ΣΔ analog-to-digital converter is used in the 50 Hz commercial power region or in the 60 Hz commercial power region. In the example shown in FIG. 3, the gain of the digital filter 5 at high frequencies lessens, so that the ΣΔ analog-to-digital converter of the second embodiment is suited for handling analog signals in the low-frequency region where the gain is high.

The digital filter 5 may be a cut-off filter (moving average filter) that the lowest frequency of the dips of the gain thereof is 10 Hz. In this case, since 50 Hz and 60 Hz are each an integral multiple of 10 Hz, the dips of the gain are obtained for both the frequencies. Therefore, the noise immunity can be improved for both 50 Hz and 60 Hz commercial frequencies as in the second embodiment. In this case, however, there is a disadvantage in that it takes time in processing of analog-to-digital conversion as compared with the second embodiment.

In the above embodiments, the measures against noise derived from the 50 Hz or 60 Hz commercial frequency are illustrated. However, noise is not limited to noise derived from the commercial frequency. Under the environment where the ΣΔ analog-to-digital converter is used, if the frequency of the noise is fixed, the invention can be applied to provide the advantage of being promoted noise immunity.

In the second embodiment, the measures against noises derived from the two frequencies are shown by way of example, but cut-off filters of three or more frequencies can also be combined against noises of three or more frequencies.

The invention is not limited to the specific embodiments described above. The invention can be widely applied to ΣΔ analog-to-digital converters each including a ΣΔ conversion section and a digital filter.

What is claimed is:

1. A ΣΔ analog-to-digital converter, comprising:
    a ΣΔ modulation section which executes ΣΔ modulation; and
    a digital filter which filters a digital signal output from the ΣΔ modulation section,
    wherein the digital filter has gain properties combining a first cut-off filter, wherein the lowest frequency of dips of a gain of the first cut-off filter corresponds to a frequency of a first noise, and a second cut-off filter, wherein the lowest frequency of dips of a gain of the second cut-off filter corresponds to a frequency of a second noise.

2. The ΣΔ analog-to-digital converter according to claim 1, wherein the frequency of the first noise is a commercial frequency.

3. The ΣΔ analog-to-digital converter according to claim 1, wherein the frequency of the second noise is a commercial frequency.

4. The ΣΔ analog-to-digital converter according to claim 1, wherein the digital filter is a moving average filter.

5. The ΣΔ analog-to-digital converter according to claim 1, wherein the frequency of the first noise or the frequency of the second noise is a commercial frequency.

6. The ΣΔ A analog-to-digital converter according to claim 5, wherein the digital filter is a moving average filter.

* * * * *